US006861963B1

(12) United States Patent
Steele et al.

(10) Patent No.: US 6,861,963 B1
(45) Date of Patent: Mar. 1, 2005

(54) ENCODING CONVERSION FALLBACK

(75) Inventors: Shawn C. Steele, Bellevue, WA (US);
Yung-shin Lin, Sammamish, WA (US);
Julie D. Bennett, Medina, WA (US);
John I. McConnell, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 10/703,813

(22) Filed: Nov. 7, 2003

(51) Int. Cl.$^7$ .............................................. H03M 7/00
(52) U.S. Cl. ...................................................... 341/50
(58) Field of Search .............................. 341/50, 90, 87; 704/200, 219, 277; 715/536; 345/87

(56) References Cited

U.S. PATENT DOCUMENTS

| | | | | |
|---|---|---|---|---|
| 5,682,158 | A | * 10/1997 | Edberg et al. | ................. 341/90 |
| 5,940,845 | A | 8/1999 | Prager et al. | ................ 715/536 |
| 5,963,155 | A | 10/1999 | Cheng et al. | .................. 341/90 |
| 6,166,666 | A | 12/2000 | Kadyk | .......................... 341/87 |
| 6,204,782 | B1 * | 3/2001 | Gonzalez et al. | ............. 341/90 |
| 6,438,516 | B1 | 8/2002 | Davis | .............................. 704/8 |
| 6,539,118 | B1 | 3/2003 | Murray et al. | ............... 382/229 |
| 6,622,239 | B1 | 9/2003 | Wong et al. | ................. 712/227 |
| 2002/0052749 | A1 | 5/2002 | Bauer | .......................... 704/277 |
| 2002/0052902 | A1 | 5/2002 | Bauer | .......................... 715/536 |

OTHER PUBLICATIONS

Stroustrup, Bjarne, "Exception Handling," *The C++ Programming Language*, 2$^{nd}$ Edition, Chapter 9, Addison–Weeley Publishing Company (1991).
"Encoding.Convert Method (Encoding, Encoding, Byte)." *.NET Framework Class Library*. Available at <http://msdn-.microsoft.com/library/en–us/cpref/html/frlrfSystemTextEncodingClassConverTopicl.asp>, Nov. 6, 2003.

"Encoding.GetEncoder Method.".*NET Framework Class Library*. Available at <http://msdn.microsoft.com/library/en–us/cpref/html/frlrfsystemtextencodingclass-getencodertopic.asp>, Nov. 6, 2003.
"ASCII Encoding Class." *.NET Framework Class Library*. Available at <http://msdn.microsoft.com/library/en–us/cpref/html/frlrfsystemtextasciiencodingclasstopic.asp>, Nov. 6, 2003.
"Encoding.GetEncoding Method." *.NET Framework Class Library*. Available at <http://msdn.microsoft.com/library/en–us/cpref/html/frlrfsystemtextencodingclass-getencodingtopic.asp>, Nov. 6, 2003.
"Encoding.GetDecoder Method." *.NET Framework Class Library*. Available at <http://msdn.microsoft.com/library/en–us/cpref/html/frlrfsystemtextencodingclass-getdecodertopic.asp>, Nov. 6, 2003.
"ASCIIEncoding Constructor." *.NET Framework Class Library*. Available at <http://msdn.microsoft.com/library/en–us/cpref/html/frlrfsystemtextasciiencoding-classctortopic.asp>, Nov. 6, 2003.
"ASCIIEncoding Members." *.NET Framework Class Library*. Available at <http://msdn.microsoft.com/library/en–us/cpref/html/frlrfsystemtextasciiencoding-memberstopic.asp>, Nov. 6, 2003.

(List continued on next page.)

*Primary Examiner*—Peguy JeanPierre
(74) *Attorney, Agent, or Firm*—Leydig, Voit & Mayer, Ltd

(57) ABSTRACT

A system and method for converting a source data sequence to a target encoding is disclosed. A fallback technique, specifiable by a user program component, is applied to data in the source data sequence that cannot be mapped to the target encoding. A particular embodiment involves methods for encoding a Unicode string as a sequence of bytes in a target encoding, and decoded the encoded bytes back to Unicode.

18 Claims, 5 Drawing Sheets

OTHER PUBLICATIONS

"Unicode in the .NET Framework." *.NET Framework Developer's Guide.* <http://msdn.microsoft.com/library/en–us/cpguide/html/cpconunicode.asp?frame+true>, Nov. 6, 2003.

"Encoding Members." *.NET Framework Class Library.* Available at <http://msdn.microsoft.com/library/en–us/cpref/html/frlrfsystemtextencodingmemberstopic.asp>, Nov. 6, 2003.

"Decoder Members." *.NET Framework Class Library.* Available at <http://msdn.microsoft.com/library/en–us/cpref/html/frlrfsystemtextdecodermemberstopic.asp>, Nov. 6, 2003.

"Decoder Class." *.NET Framework Class Library.* Available at <http://msdn.microsoft.com/library/en–us/cpref/html/frlrfsystemtextdecoderclasstopic.asp>, Nov. 6, 2003.

"System.Text Namespace." *.NET Framework Class Library.* Available at <http://msdn.microsoft.com/library/en–us/cpref/html/frlrfSystemText.asp?frame+true>, Nov. 6, 2003.

"Using Unicode Encoding." *.NET Framework Developer's Guide.* Available at <http://msdn.microsoft.com/library/en–us/cpguide/html/cpconusingunicodeencoding.asp?frame+true>, Nov. 6, 2003.

"Introduction to MLang." Available at <http://msdn.microsoft.com/workshop/misc/mlang/overview/overview.asp>, Nov. 6, 2003.

"MLCONVCHAR Enumerated Type." Available at <http://msdn.microsoft.com/workshop/misc/mlang/reference/enums/mlconvchar.asp>, Nov. 6, 2003.

"ConvertINetString Function." Available at <http://msdn.microsoft.com/workshop/misc/mlang/reference/functions/convertinetstring.asp>, Nov. 6, 2003.

"MLang." Available at <http://msdn.microsoft.com/workshop/misc/mlang/mlang.asp?frame+true>, Nov. 6, 2003.

"IMultiLanguage::ConvertString Method." Available at <http://msdn.microsoft.com/workshop/misc/mlang/reference/ifaces/imultilanguage/convertstring.asp>, Nov. 6, 2003.

"IMultiLanguage Interface." Available at <http://msdn.microsoft.com/workshop/misc/mlang/reference/ifaces/imultilanguage/imultilanguage.asp>, Nov. 6, 2003.

"IMultiLanguage2 Interface." Available at <http://msdn.microsoft.com/workshop/misc/mlang/reference/ifaces/imultilanguage2/imultilanguage2.asp>, Nov. 6, 2003.

"IMultiLanguage2::ConvertStringInIStream Method." Available at <http://msdn.microsoft.com/workshop/misc/mlang/reference/ifaces/imultilanguage2/convertstringinistream.asp>, Nov. 6, 2003.

"IMultiLanguage2::ConvertStringFromUnicodeEx Method." Available at <http://msdn.microsoft.com/workshop/misc/mlang/reference/ifaces/imultilanguage2/convertstringfromunicodeex.asp>, Nov. 6, 2003.

"IMultiLanguage::ConvertStringFromUnicode Method." Available at <http://msdn.microsoft.com/workshop/misc/mlang/reference/ifaces/imultilange/convertstringfromunicode.asp>, Nov. 6, 2003.

"IMultiLanguage2::ConvertStringToUnicodeEx Method." Available at <http://msdn.microsoft.com/workshop/misc/mlang/reference/ifaces/imultilanguage2/convertstringtounicodeex.asp>, Nov. 6, 2003.

"IMultiLanguage::ConvertStringToUnicode Method." Available at <http://msdn.microsoft.com/workshop/misc/mlang/reference/ifaces/imultilanguage/convertstringtounicode.asp>, Nov. 6, 2003.

"IMLangConvertCharset::DoConversionFromUnicode Method." Available at <http://msdn.microsoft.com/workshop/misc/mlang/reference/ifaces/imlangconvertcharset/doconversionfromunicode.asp>, Nov. 6, 2003.

"IMultiLanguage::CreateConvertCharset Method." Available at <http://msdn.microsoft.com/workshop/misc/mlang/reference/ifaces/imultilanguage/createconvertcharset.asp>, Nov. 6, 2003.

"IMLangConvertCharset Interface." Available at <http://msdn.microsoft.com/workshop/misc/mlang/reference/ifaces/imlangconvertcharset/imlangconvertcharset.asp>, Nov. 6, 2003.

"IMLangConvertCharset::DoConversion Method." Available at <http://msdn.microsoft.com/workshop/misc/mlang/reference/ifaces/imlangconvertcharset/doconversion.asp>, Nov. 6, 2003.

"Conversion Object." Available at <http://msdn.microsoft.com/workshop/misc/mlang/reference/objects/cmlangconvertcharset.asp>, Nov. 6, 2003.

"IMLangConvertCharset::Initialize Method." Available at <http://msdn.microsoft.com/workshop/misc/mlang/reference/ifaces/imlangconvertcharset/initialize.asp>, Nov. 6, 2003.

"IMultiLanguage::IsConvertible Method." Available at <http://msdn.microsoft.com/workshop/misc/mlang/reference/ifaces/imultilanguage/isconvertible.asp>, Nov. 6, 2003.

"IMultiLanguage2::ConvertStringToUnicode Method." Available at <http://msdn.microsoft.com/workshop/misc/mlang/reference/ifaces/imultilanguage2/convertstringtounicode.asp>, Nov. 6, 2003.

"IMLangConvertCharset::DoConversionToUnicode Method." Available at <http://msdn.microsoft.com/workshop/misc/mlang/reference/ifaces/imlangconvertcharset/doconversiontounicode.asp>, Nov. 6, 2003.

"ConvertINetMultiByteToUnicode Function." Available at <http://msdn.microsoft.com/workshop/misc/mlang/reference/functions/convertinetmultibytetounicode.asp>, Nov. 6, 2003.

"ConvertINetUnicodeToMultiByte Function." Available at <http://msdn.microsoft.com/workshop/misc/mlang/reference/functions/convertinetunicodetomultibyte.asp>, Nov. 6, 2003.

"IMLangCodePages Interface." Available at <http://msdn.microsoft.com/workshop/misc/mlang/reference/ifaces/imlangcodepages/imlangcodepages.asp>, Nov. 6, 2003.

"IsConvertINetStringAvailable Function." Available at <http://msdn.microsoft.com/workshop/misc/mlang/reference/functions/isconvertinetstringavailable.asp>, Nov. 6, 2003.

* cited by examiner

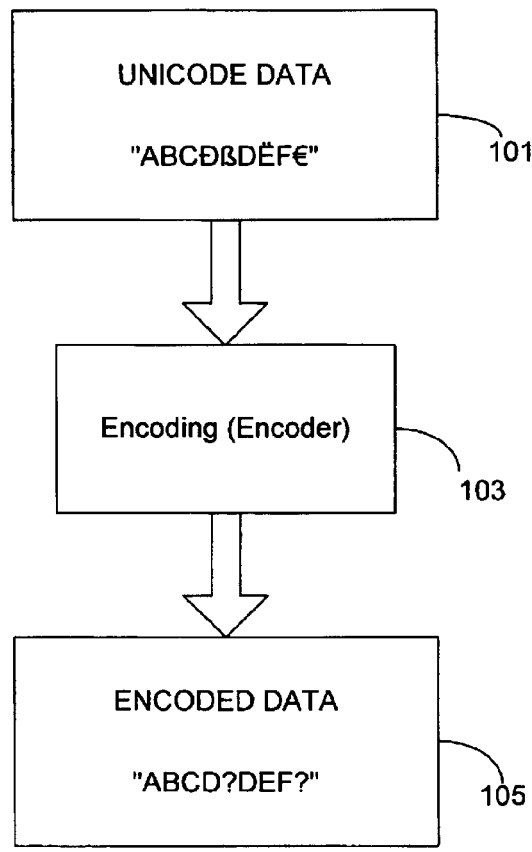
FIG. 1A
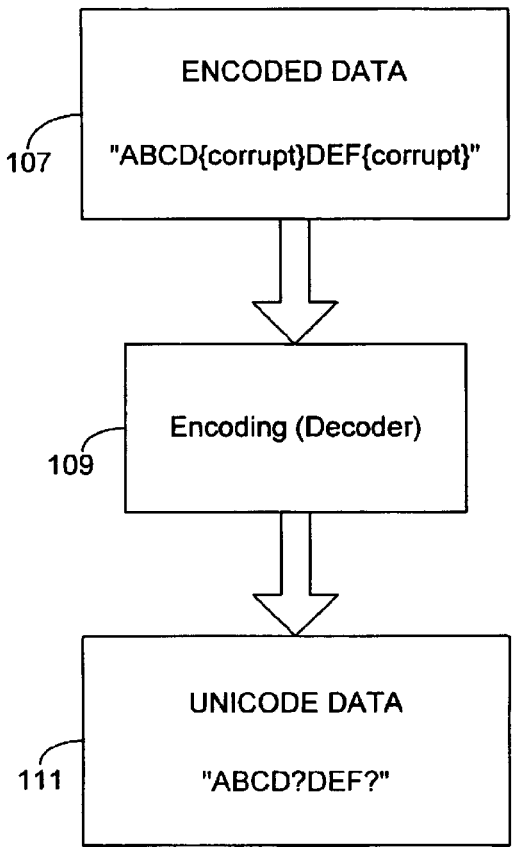
FIG. 1B
FIG. 1

ENCODING CONVERSION FALLBACK

FIELD OF THE INVENTION

Te present invention relates generally to encodings of data in computer systems, and more particularly to methods and mechanisms for conversions from one encoding to another.

BACKGROUND OF THE INVENTION

Modem computer systems typically provide facilities for representing text, as for example on a monitor or other display device. Because a computer stores text in digital format, a character set encoding is used to map a character to a unique digital representation. Numerous character set encodings (or codepages) have been developed; some well-known examples include Unicode, ISO-10646, ASCII, ISCII, ISO-2022, and EUC. Character set encodings vary significantly in their scope; certain encodings are suited to particular languages and writing systems. At one extreme, the Unicode standard supports millions of characters using 16-bit encodings and incorporates most writing systems in contemporary use. By contrast, ASCII supports only 127 characters. In general, two distinct encodings will not support the same set of characters. Because many different encodings for printing and displaying text characters are in use, it is often necessary to convert text from one encoding to another. The growth in worldwide computer-based communications involving users working with different languages and writing systems has made more critical the need for effective means of conversion between encodings.

Conversion between encodings is sometimes a straightforward matter. For each character in a source encoding string, some method or mechanism is used in order to determine the representation for the character in the target encoding. This might involve something as simple as a table lookup or a shift sequence. Conversion presents difficulties, however, when a character in the source encoding has no defined mapping to a character in the target encoding. In such a situation, a "fallback" technique may be applied to the character that is unknown or invalid in the target encoding.

Perhaps the simplest fallback solution involves substituting a space or a default symbol, such as '?' or '□', in place of the unknown or invalid source character. This fallback technique may be called a "replacement fallback" approach. For example, the source string "≈Hello world≈" might be converted to "?Hello world?" in a target encoding that does not recognize or provide a mapping for the character '≈'. This solution, while easy to apply, will often be undesirable. In particular, the loss of information involved in the fallback conversion will generally make it impossible to recover the source when reversing the direction of the conversion.

In another common fallback technique, known as "best fit," the invalid or unknown input character is converted to the character in the target encoding with the nearest graphical likeness. For example, a source character 'A' might be represented as 'Ä' in ASCII, which has no A-diaeresis character. As with the replacement fallback technique, best-fit will have drawbacks in many situations. It can lead to compromises in security. For example, if an account on a system is protected by the password "Bjorn", an intruder could gain access to the account with the input "Bjorn" if the input is subjected to a best-fit conversion. Naive substitution of visually-similar characters may alter or obscure the intended meaning of a sequence of characters in undesirable ways. Decoding of encoded text back to the source may become impossible.

No single fallback mechanism can be devised that will be suitable or desirable in all encoding conversion situations. Nevertheless, in most encoding conversion systems only one fallback technique is provided. Where some ability to define or select among different fallback approaches has been provided, it has been on a very restricted and non-extensible basis.

SUMMARY OF THE INVENTION

In accordance with one aspect of the present invention, a system for converting a source data sequence to a target encoding is provided. The system includes a user program component, an encoding component, and a fallback component. The fallback component applies a fallback technique, specified by the user program, to data in the source data sequence that cannot be mapped to the target encoding by the encoding component.

In accordance with another aspect of the invention, a method for converting a source data sequence to a target encoding is provided. If an element of the source data sequence cannot be represented in the target encoding, a fallback routine, selected by a user program, is executed.

In accordance with another aspect of the invention, a method is provided for encoding a Unicode string as a sequence of bytes in a target encoding. If a fallback buffer is empty, the next input buffer character, if any, is read. If the character can be represented in the target encoding, the character is encoded; otherwise, a specified fallback routine is applied to the character.

In accordance with another aspect of the invention, a method for decoding a sequence of bytes to an original Unicode encoding is provided. One or more input bytes are read from an input buffer. If the input can be decoded to Unicode, the resulting Unicode string is added to an output buffer; otherwise, a specified fallback routine is applied to the input.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings, of which:

FIG. 1 is a block diagram broadly illustrating the processes of encoding and decoding in accordance with an embodiment of the present invention;

DETAILED DESCRIPTION

Figure 2:
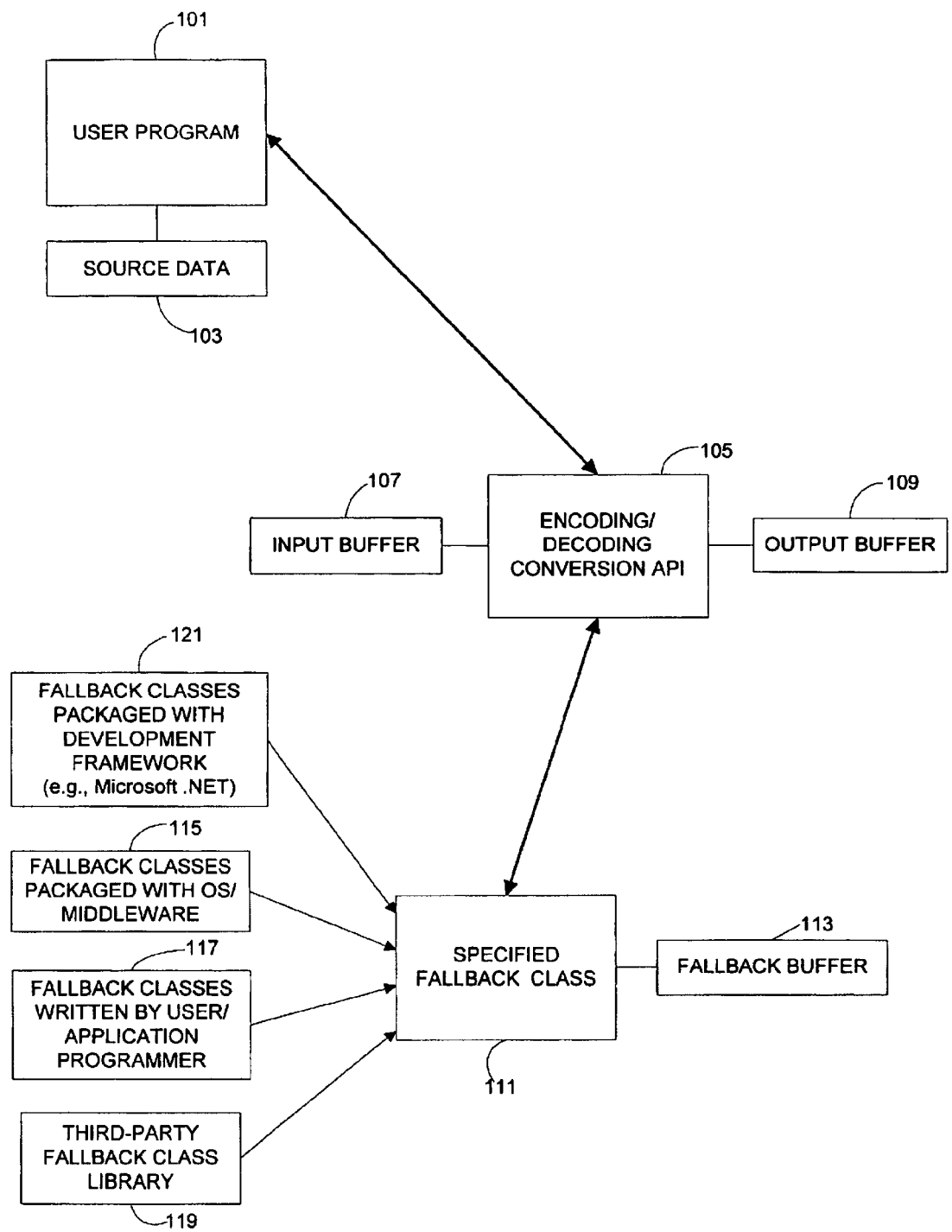
FIG. 2 is a block diagram generally illustrating the architecture of a system in accordance with an embodiment of the invention.

Certain embodiments of the invention are discussed below with reference to FIGS. 1–5. However, those skilled in the art will readily appreciate that the detailed description given herein with respect to these figures is for illustrative purposes, and that the invention extends beyond these embodiments.

As broadly illustrated in FIG. 1, an embodiment of the present invention provides for extensible conversion fallback in the context of both "encoding" and "decoding" data. In this specialized usage, a Unicode string 101 is "encoded" by being converted to a representation 105 in some other character set encoding or codepage, such as ASCII. Thereafter a sequence of encoded bytes 107 can be "decoded" back to a Unicode representation 111. In an embodiment, the encoding and decoding are done by way of declaring objects 103, 109 of an Encoding class, which can make further use of objects of Encoder and Decoder classes, which form part of the class library made available in the .NET development framework of Microsoft Corporation. In accordance with the present invention, these objects in turn make use of fallback class objects, so that source data that cannot be directly represented in the target encoding or in the conversion back to Unicode can be handled appropriately in accordance with specified fallback techniques. It should be noted that the present invention is not restricted to conversions to and from Unicode. Instead, it is applicable more generally to conversions between different encoding systems.

FIG. 2 provides a high-level architectural view of one embodiment of the present invention. A user program component 101 requires the conversion of source data 103, such as text data encoded in a particular character set, to a target encoding. The user program 101 calls one or more functions made available by way of an encoding/decoding component 105 comprising one or more application programming interfaces (APIs) to perform the conversion and return the converted data. The encoding/decoding Component 105 makes use of an input buffer 107 and an output buffer 109. If the conversion routine, acting upon the source data, encounters a character, byte, or other data unit that has no mapping in the target encoding or that is otherwise unknown or invalid, a fallback class component 111 specified by the user program is invoked. The fallback component 111, making use of a fallback buffer 113, applies a defined fallback technique to the invalid input. The fallback component 111 sends the result back to the encoding/decoding API component 105, which then communicates the result to the user program component 101.

The independence of the fallback class component 111 in the design presented in FIG. 2 permits a wide variety of fallback techniques to be used. In addition to the conventional replacement and best-fit fallback solutions discussed in the background section above, an exemplary fallback technique can involve throwing an exception. An exemplary fallback can also include resynchronizing the input data stream. In an embodiment, a replacement fallback technique can include a mechanism to detect whether the replacement approach has caused the fallback routine to become stuck in a loop. The system design of FIG. 2 allows for the fallback class to be chosen from a variety of sources. The fallback class can be included as part of a development framework, such as Microsoft Corporation's NET framework 121; it can be supplied by an operating system or middleware system vendor 115; it can be designed by the user or application programmer 117 associated with the user program 101; or it can be chosen from a third-party fallback class library 119. This design allows for reuse of middleware libraries and other libraries. Moreover, it enables a fallback to be used with an encoding without the fallback designer having to know precisely how the encoding works, and without the encoding designer having to know precisely how the fallback works.

Figure 3:
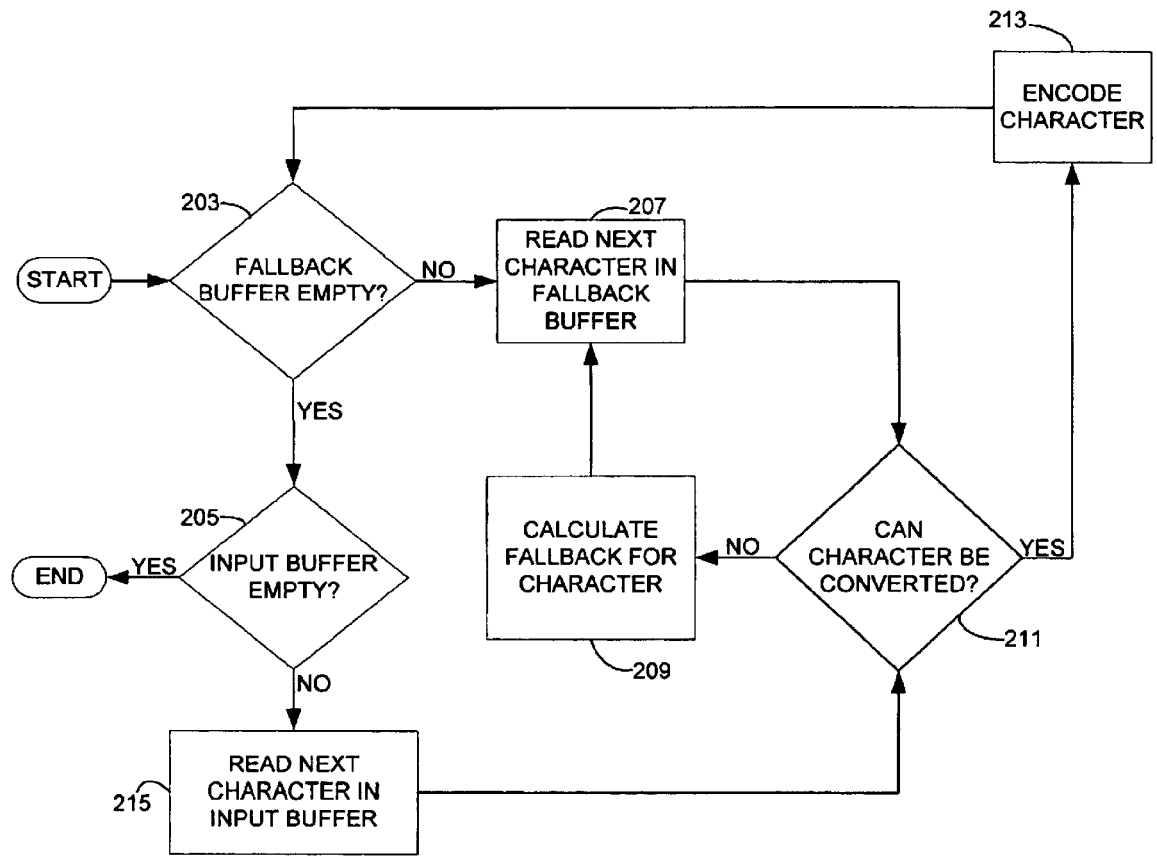
FIG. 3 is a flow diagram generally illustrating steps involving the encoding of Unicode source data in accordance with an embodiment of the invention.

The flow diagram of FIG. 3 illustrates steps involving encoding Unicode source data in an embodiment of the invention. Input characters that cannot be encoded are handled in accordance with a fallback. Initially, at step 203, the fallback buffer is examined in case there is any fallback data remaining to be processed from a previous iteration of the procedure. If the fallback buffer is empty, the input buffer is then examined at step 205. If the input buffer is empty, the procedure terminates. If there is data in the input buffer, at step 215 the next character is read. Decision block 211 determines whether the character has a straightforward conversion in the target encoding. If so, the character is encoded at step 213, and the procedure returns to the initial step 203. If, however, the character cannot be mapped to the target encoding, a fallback is calculated for the input character at step 209. The next character in the fallback buffer is read at step 207, and decision block 211 is entered again. If, in the initial step 203, the fallback buffer is not empty, the procedure proceeds from step 207, reading the next character in the fallback buffer.

Figure 4:
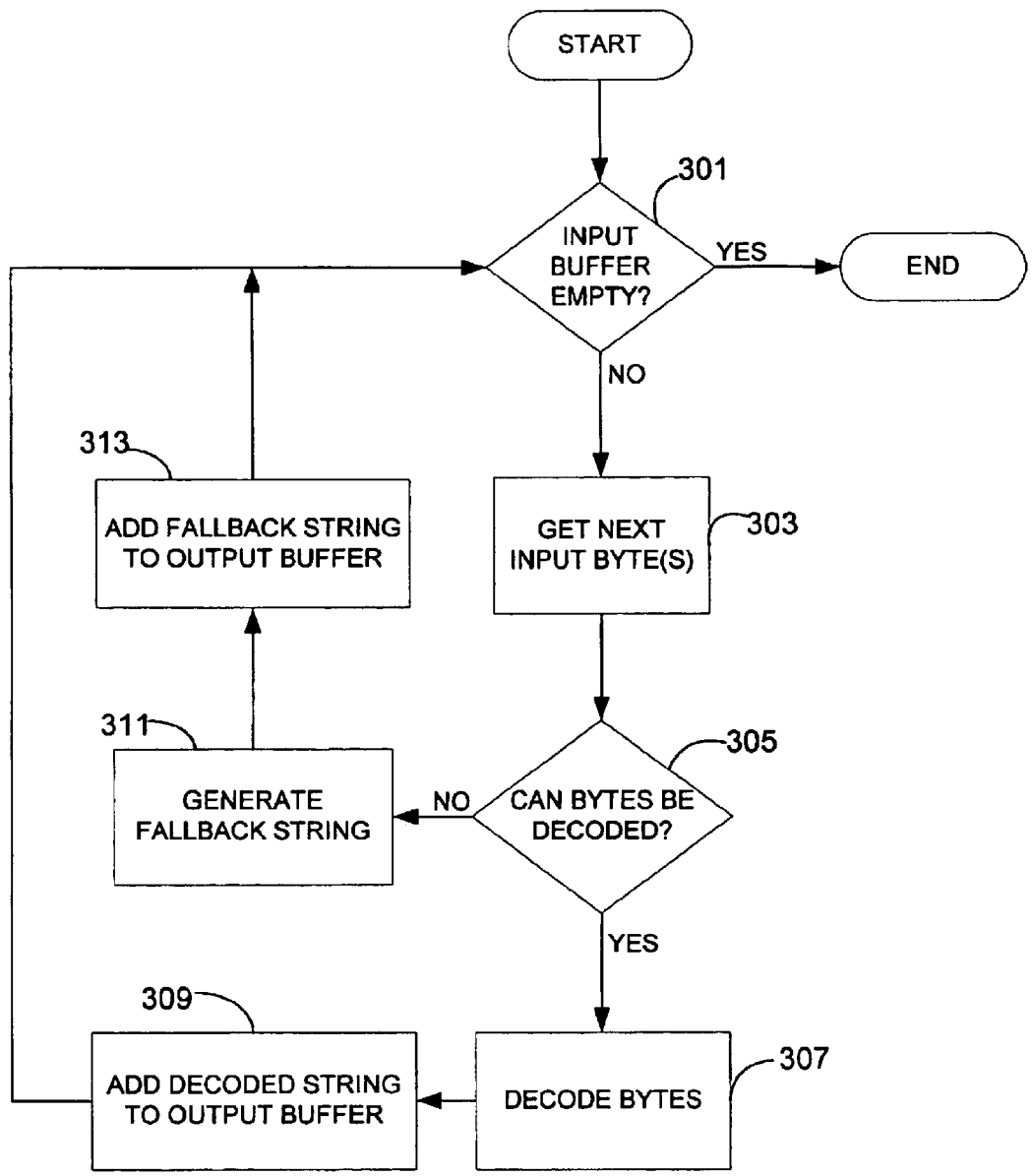
FIG. 4 is a flow diagram generally illustrating steps involving the decoding of encoded bytes back to Unicode in accordance with an embodiment of the invention.

The flow diagram of FIG. 4 illustrates corresponding steps involving decoding a sequence of bytes represented encoded Unicode data. Again, input characters that cannot be encoded are handled in accordance with a fallback. Initially, at step 301, the input buffer is examined. If it is empty, the procedure terminates. If there is data in the input buffer, the next input byte, or set of bytes, is obtained at step 303. Decision block 305 determines whether the byte or-bytes can be decoded back to Unicode. If so, at step 307 the conversion occurs, and at step 309 the decoded string is added to the output buffer. The procedure then returns to the initial step 301, examining the input buffer. If, at decision block 305, it is determined that the input byte or bytes cannot be decoded to Unicode, at step 311 a fallback string is generated, and at step 313 the fallback string is added to the output buffer. The procedure then returns to the initial step 301. Note that while FIGS. 3 and 4 assume that the fallback technique results in data that can then be incorporated in the encoded or decoded output, it is also possible for a fallback to throw an exception or provide some other alternative execution path.

In the embodiment depicted in FIGS. 3 and 4, the execution paths for encoding and decoding are different primarily because it is assumed that fallback output will be in Unicode for consistency. In an alternative embodiment, fallback output can be in the target codepage, in which case the encoding execution path would resemble the decoding process presented in FIG. 4. In another alternative embodiment, fallback output can be provided in a third data representation, in which case both the encoding and decoding execution paths would resemble the encoding process presented in FIG. 3.

In an embodiment of the invention, a round-trip conversion of data without loss is possible in cases where the source data is not directly encodable in the target representation. For example, suppose that the source data is a Unicode string including the Unicode character 'Ä', and that the target encoding does not support 'Ä'. The Unicode value of the character 'A' is \u00c1. A fallback can encode "Ä" as "&00C1", allowing lossless conversion back to Unicode "Ä" from the target representation.

The invention has been described with respect to embodiments involving conversions between character set encodings. However, the invention is also applicable to other kinds of encoding conversions of input. For example, the invention can be applied to the decoding of an encrypted text document, or to the decoding of a compressed text document, with customized fallback routines being executed in situations involving loss of data or some other difficulty in transforming the data back to the unencrypted or uncompressed form. The invention can also be applied to the use of encoding in reading or writing a data stream of any sort, such as a data stream to or from disk, radio transmission data, or peripheral device communication in general.

Figure 5:
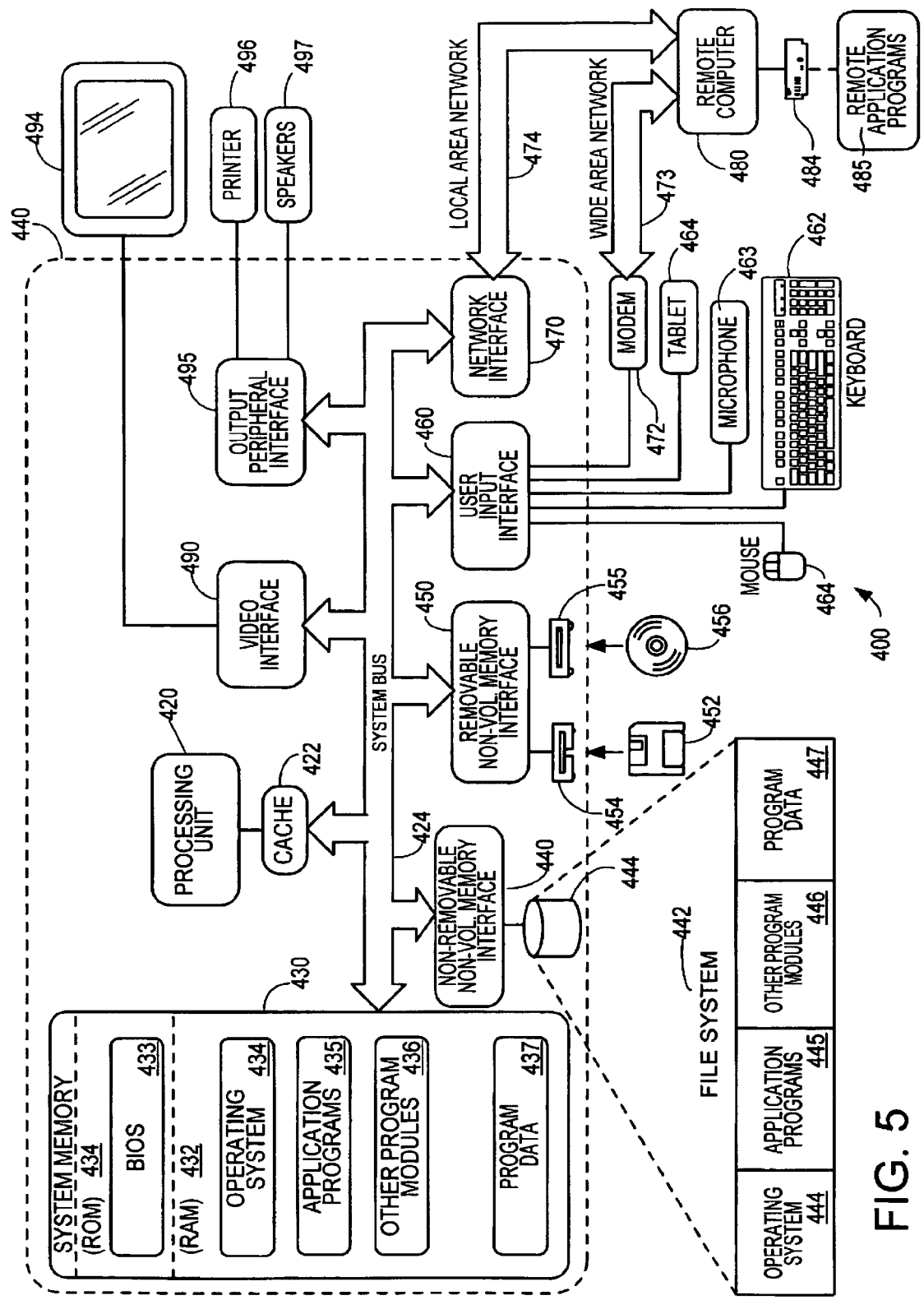
FIG. 5 is a diagram generally illustrating an exemplary computer environment within which aspects of the present invention can be incorporated.

FIG. 5 illustrates one exemplary computing environment 400 within which the present invention can be performed. The environment 400 includes a general-purpose stored-program computer machine 440, which can be connected to one or more other computer-based resources, such as a remote computer 480 connected to the computer device 440 by a local area network 474 or wide area network 473. The computer machine 440 includes at least one central processing unit 420 connected by a system bus 424 to a primary memory 430. One or more levels of a cache 422, connected to or situated within the processing unit 420, act as a buffer for the primary memory 430. Programs, comprising sets of instructions for the machine 440, are stored in the memory 430, from which they can be retrieved and executed by the processing unit 420. In the course of executing program instructions, the processing unit 420 retrieves data 437 stored in the memory 430 when necessary. Among the programs and program modules stored in the memory 430 are those that comprise an operating system 434.

The exemplary computer machine 440 further includes various input/output devices and media, such as a display 494 and a printer 496, and including secondary storage devices such as a non-removable magnetic hard disk 444, a removable magnetic disk 452, and a removable optical disk 456. Such computer-readable media provide nonvolatile storage of computer-executable instructions and data; the hard disk 444 is also commonly used along with the primary memory 430 in providing virtual memory. It will be appreciated by those skilled in the art that other types of computer-readable media that can provide volatile and nonvolatile storage of data accessible by a computer can also be used in the exemplary computer environment 400. The computer 440 has a file system 442 associated with the operating system 434. The file system 442 serves as an interface that maps a set of logically-organized named files to data physically stored on secondary media, such as data stored in clusters or sectors on the hard disk 444.

While illustrative embodiments of the invention have been illustrated and described, it will be appreciated that various changes can be made without departing from the invention. Similarly, any process steps described herein may be interchangeable with other steps in order to achieve the same result. In addition, the illustrative examples described above are not intended to be exhaustive or to limit the invention to the precise forms disclosed. On the contrary, the intention is to cover all modifications, alternative constructions, and equivalents falling within the spirit and scope of the invention.

What is claimed is:

1. A method for encoding a Unicode string as a sequence of bytes in a target encoding, the method comprising iteratively performing the following steps:
   (a) if a fallback buffer is empty, and an input buffer is not empty:
      getting an input character from the input buffer;
      if the input character can be represented in the target encoding, encoding the input character; and
      otherwise, if the input character cannot be represented in the target encoding, executing a specified fallback routine on the input character;
   (b) if the fallback buffer is not empty:
      getting a fallback character from the fallback buffer;
      if the fallback character can be represented in the target encoding, encoding the fallback character; and
      otherwise, if the fallback character cannot be represented in the target encoding, executing the specified fallback routine on the fallback character.

2. The method of claim 1 wherein executing the specified fallback routine comprises executing a replacement fallback routine.

3. The method of claim 1 wherein executing the specified fallback routine comprises executing a best fit fallback routine.

4. The method of claim 1 wherein executing the specified fallback routine comprises throwing an exception.

5. A method for decoding a sequence of bytes to an original Unicode encoding, the method comprising iteratively performing the following steps until an input buffer is empty:
   getting one or more input bytes from the input buffer;
   if the one or more input bytes can be decoded to Unicode, decoding the one or more input bytes to yield a Unicode string, and
      adding the Unicode string to an output buffer; and
   otherwise, if the one or more input bytes cannot be decoded to Unicode,
      executing a specified fallback routine on the one or more input bytes.

6. The method of claim 5 wherein executing the specified fallback routine further comprises:
   generating a fallback string; and
   adding the fallback string to the output buffer.

7. The method of claim 5 wherein executing the specified fallback routine comprises executing a replacement fallback routine.

8. The method of claim 5 wherein executing the specified fallback routine comprises executing a best fit fallback routine.

9. The method of claim 5 wherein executing the specified fallback routine comprises throwing an exception.

10. A computer-readable medium having computer-executable instructions implementing a method for encoding a Unicode string as a sequence of bytes in a target encoding, the method comprising iteratively performing the following steps:
    (a) if a fallback buffer is empty, and an input buffer is not empty:
       getting an input character from the input buffer;
       if the input character can be represented in the target encoding, encoding the input character; and
       otherwise, if-the input character cannot be represented in the target encoding, executing a specified fallback routine on the input character;
    (b) if the fallback buffer is not empty:
       getting a fallback character from the fallback buffer;
       if the fallback character can be represented in the target encoding, encoding the fallback character; and
       otherwise, if the fallback character cannot be represented in the target encoding, executing the specified fallback routine on the fallback character.

11. The computer-readable medium of claim 10 wherein executing the specified fallback routine comprises executing a replacement fallback routine.

12. The computer-readable medium of claim 10 wherein executing the specified fallback routine comprises executing a best fit fallback routine.

13. The computer-readable medium of claim 10 wherein executing the specified fallback routine comprises throwing an exception.

14. A computer-readable medium having computer-executable instructions implementing a method for decoding a sequence of bytes to an original Unicode encoding, the method comprising iteratively performing the following steps until an input buffer is empty:

getting one or more input bytes from the input buffer;

if the one or more input bytes can be decoded to Unicode,
   decoding the one or more input bytes to yield a Unicode string; and
   adding the Unicode string to an output buffer; and otherwise, if the one or more input bytes cannot be decoded to Unicode,
   executing a specified fallback routine on the one or more input bytes.

15. The computer-readable medium of claim 14 wherein executing the specified fallback routine further comprises:
   generating a fallback string; and
   adding the fallback string to the output buffer.

16. The computer-readable medium of claim 14 wherein executing the specified fallback routine comprises executing a replacement fallback routine.

17. The computer-readable medium of claim 14 wherein executing the specified fallback routine comprises executing a best fit fallback routine.

18. The computer-readable medium of claim 14 wherein executing the specified fallback routine comprises throwing an exception.

* * * * *